(12) United States Patent
Carey

(10) Patent No.: US 8,081,710 B2
(45) Date of Patent: Dec. 20, 2011

(54) SYSTEM AND METHOD FOR CORRECTED MODULATION WITH NONLINEAR POWER AMPLIFICATION

(75) Inventor: Eoin Carey, Cork (IE)

(73) Assignee: Pine Valley Investments, Inc., Las Vegas, NV (US)

( * ) Notice: Subject to any disclaimer, the term of this patent is extended or adjusted under 35 U.S.C. 154(b) by 842 days.

(21) Appl. No.: 11/937,270

(22) Filed: Nov. 8, 2007

(65) Prior Publication Data

US 2009/0122911 A1    May 14, 2009

(51) Int. Cl.
 *H04L 25/49* (2006.01)
(52) U.S. Cl. ........ 375/296; 375/295; 375/254; 375/284; 375/285; 375/278; 375/227; 375/259
(58) Field of Classification Search .......... 375/296, 375/295, 254, 284, 285, 278, 227, 259
See application file for complete search history.

(56) References Cited

U.S. PATENT DOCUMENTS

| | | | |
|---|---|---|---|
| 5,745,527 A | 4/1998 | Kelton et al. | |
| 6,043,707 A | 3/2000 | Budnik | |
| 6,141,390 A | 10/2000 | Cova | |
| 6,304,140 B1* | 10/2001 | Thron et al. | 330/149 |
| 6,445,249 B1 | 9/2002 | Khan et al. | |
| 6,600,369 B2 | 7/2003 | Mitzlaff | |
| 6,650,691 B2 | 11/2003 | Cramer, III | |
| 6,735,419 B2 | 5/2004 | Mitzlaff | |
| 6,834,183 B2 | 12/2004 | Black et al. | |
| 6,850,574 B2 | 2/2005 | Schwent et al. | |
| 6,898,252 B1 | 5/2005 | Yellin et al. | |
| 6,937,874 B2 | 8/2005 | Cramer, III | |
| 7,012,970 B2 | 3/2006 | Greenwood et al. | |
| 7,020,215 B2 | 3/2006 | Porco et al. | |
| 7,085,330 B1* | 8/2006 | Shirali | 375/296 |
| 7,289,777 B2 | 10/2007 | Mohsen et al. | |
| 7,333,781 B1 | 2/2008 | Stockstad et al. | |
| 7,340,235 B1 | 3/2008 | Madsen et al. | |
| 7,449,960 B2* | 11/2008 | Bunch et al. | 331/1 A |
| 7,742,748 B2* | 6/2010 | Matero et al. | 455/114.3 |
| 7,869,543 B2* | 1/2011 | Reddy et al. | 375/296 |
| 7,962,108 B1 | 6/2011 | Khlat et al. | |
| 2002/0196864 A1* | 12/2002 | Booth et al. | 375/296 |
| 2003/0095608 A1 | 5/2003 | Duperray | |
| 2003/0102912 A1 | 6/2003 | Tripathi et al. | |
| 2003/0215025 A1 | 11/2003 | Hietala | |
| 2003/0215026 A1 | 11/2003 | Hietala | |

(Continued)

OTHER PUBLICATIONS

Information about Related Patents and Patent Applications, see section 6 of the accompanying Information Disclosure Statement Letter, which concerns Related Patents and Patent Applications.

*Primary Examiner* — Kenneth Lam
(74) *Attorney, Agent, or Firm* — Fox Rothschild, LLP; Robert J. Sacco

(57) ABSTRACT

A system and method for modulating and amplifying an input signal are provided in a communication transmitter. The transmitter includes a pre-distortion lookup table containing pre-distortion lookup data. An auto-calibration module is in communication with the pre-distortion lookup table. The auto-calibration module is configured to operate during a closed-loop auto-calibration interval and to calibrate the pre-distortion lookup data to compensate for a non-linearity in the transmitter. The pre-distortion is based on the pre-distortion lookup data and is used during an open-loop operational interval.

11 Claims, 4 Drawing Sheets

U.S. PATENT DOCUMENTS

| | | |
|---|---|---|
| 2004/0047432 A1 | 3/2004 | Iwasaki |
| 2004/0208259 A1* | 10/2004 | Hunton ........................ 375/296 |
| 2004/0219891 A1 | 11/2004 | Hadjichristos |
| 2004/0242170 A1 | 12/2004 | Gilbert |
| 2005/0085198 A1* | 4/2005 | Anvari ..................... 455/114.3 |
| 2005/0122166 A1 | 6/2005 | Premakanthan et al. |
| 2005/0130609 A1 | 6/2005 | Nagode et al. |
| 2005/0245208 A1 | 11/2005 | Udagawa et al. |
| 2006/0067424 A1 | 3/2006 | Wolf |
| 2006/0128324 A1 | 6/2006 | Tan et al. |
| 2006/0178120 A1 | 8/2006 | Puma |
| 2007/0189417 A1 | 8/2007 | Waheed et al. |
| 2007/0190952 A1* | 8/2007 | Waheed et al. ............ 455/114.3 |
| 2007/0211821 A1* | 9/2007 | Haque et al. ................. 375/297 |
| 2007/0223621 A1 | 9/2007 | Ahmed |
| 2007/0230612 A1 | 10/2007 | Ahmed |
| 2008/0051042 A1 | 2/2008 | Komaili et al. |
| 2008/0074209 A1* | 3/2008 | Ceylan et al. ................. 332/144 |
| 2008/0225981 A1 | 9/2008 | Reddy et al. |
| 2008/0225984 A1* | 9/2008 | Ahmed et al. ................ 375/302 |
| 2009/0052575 A1 | 2/2009 | Waheed et al. |
| 2009/0054000 A1* | 2/2009 | Waheed et al. ............... 455/63.1 |
| 2009/0054018 A1* | 2/2009 | Waheed et al. ............... 455/126 |
| 2009/0202018 A1 | 8/2009 | Reddy et al. |
| 2009/0251195 A1 | 10/2009 | Ahmed et al. |
| 2009/0280758 A1 | 11/2009 | Pratt et al. |
| 2010/0009642 A1 | 1/2010 | Pratt et al. |
| 2010/0027711 A1* | 2/2010 | Manku et al. ................. 375/295 |

* cited by examiner

SYSTEM AND METHOD FOR CORRECTED MODULATION WITH NONLINEAR POWER AMPLIFICATION

FIELD OF THE INVENTION

This invention relates to transmission of communication signals, and specifically to systems and methods for corrected modulation with non-linear power amplification.

BACKGROUND OF THE INVENTION

As wireless phone standards continue to evolve to 3G and beyond, for example, WCDMA (Wideband Code Division Multiple Access), HSUPA (High-Speed Uplink Packet Access), and eventually 3G LTE (Long-Term Evolution), the demand for non-constant envelope modulation is growing rapidly. There is an increasing need for modulation and power-control schemes that permit nonlinear power amplifiers to operate in the saturation (nonlinear) region, which provides higher power efficiency and longer battery lifetime.

In nonlinear devices, waveform quality typically increases with a more linear output response. However, some nonlinear devices operate more efficiently when the output response is nonlinear—for example, when a power amplifier approaches saturation. As a result, there is often a tradeoff between waveform quality and efficiency. For example, when a nonlinear device approaches saturation or starts to exhibit nonlinear qualities (which may improve efficiency), the waveform quality may be degraded and may not meet the specific requirements and standards. Alternatively, if nonlinear devices are set to operate in linear regions to meet quality standards or requirements, then power consumption and current drain may be degraded because the device is operating at a lower efficiency level.

Correction of the nonlinearity of the power amplifier becomes extremely challenging in the context of non-constant envelope modulation. Two primary approaches exist: open-loop LUT (lookup table) correction and closed-loop error based correction. Open-loop correction is relatively simple, but needs significant manufacturing calibration for collecting tables or calculating the coefficients, and suffers performance loss if the device nonlinearity varies once out of the manufacturing environment and the pre-collected tables or pre-calculated coefficients are no longer accurate enough. The error based closed-loop correction, either non-adaptive or adaptive, is a classical linear control loop scheme and fails at delivering accurate correction to severe nonlinearity, especially for a high gain loop with large delay.

A third, hybrid approach has been proposed for certain polar modulation schemes, particularly for use with GSM/EDGE. This hybrid polar modulation approach involves generating an LUT in real-time during a closed-loop calibration interval and then using the LUT to correct a signal during an open-loop operation interval. This approach is suitable for use with GSM/EDGE, but newer 3G modulation schemes, such as WCDMA, HSUPA, and LTE, introduce significant new challenges in synchronizing the signal data in the LUT. The hybrid polar modulation approach can maintain synchronization with timing misalignments of 20 ns (nanoseconds) or less, which is tolerable for purposes of GSM/EDGE. HSUPA, by contrast, is estimated to tolerate a maximum timing misalignment of approximately 2 ns—ten times smaller than the tolerable misalignment for GSM/EDGE. To achieve this high level of synchronization with the hybrid polar modulation approach would require a dedicated synchronization solution, including additional hardware and complexity.

Thus, there is a need for reliable and efficient systems and methods for efficient, highly-synchronized, linearly-corrected modulation in communication transmission systems. There is a further need for reliable and efficient systems and methods for synchronized, pre-distorted I/Q modulation for use with non-linear power amplifiers.

BRIEF SUMMARY

According to one aspect of the invention, there is a communication transmitter. The transmitter includes a pre-distortion lookup table containing pre-distortion lookup data. An auto-calibration module is in communication with the pre-distortion lookup table. The auto-calibration module is configured to operate during a closed-loop auto-calibration interval and to calibrate the pre-distortion lookup data to compensate for a nonlinearity in the transmitter. A baseband processor is in communication with the pre-distortion lookup table. The baseband processor is configured to receive an input signal and to generate a pre-distorted baseband I/Q signal pair. The pre-distortion is based on the pre-distortion lookup data during an open-loop operational interval. An I/Q modulator is in communication with the baseband processor. The I/Q modulator is configured to modulate an RF carrier signal based on the pre-distorted baseband I/Q signal pair and to generate a pre-distorted, modulated RF carrier signal. A power amplifier is in communication with the baseband processor and the I/Q modulator. The power amplifier is configured to amplify the corrected, modulated RF carrier signal and to generate an amplified RF signal. A digital feedback path is in communication with the power amplifier and the baseband processor. The digital feedback path is configured to provide a feedback signal to the baseband processor during the closed-loop auto-calibration interval.

According to another aspect of the invention, there is a method for modulating and amplifying an input signal in a communication transmitter. A digital feedback path is activated during an auto-calibration interval. A plurality of samples of an input signal and a plurality of samples of a feedback signal are collected. The input signal samples and the feedback signal samples are correlated, and a synchronization factor for synchronizing the input signal samples and the feedback signal samples is determined. A plurality of pre-distortion lookup data is determined based on the input signal samples, the feedback signal samples, and the synchronization factor. The digital feedback path is deactivated during a subsequent operational interval, and the input signal is pre-distorted based on the pre-distortion lookup data. An RF carrier signal is modulated based on the pre-distorted input signal, the modulated RF carrier signal is amplified.

Other systems, methods, features and advantages of the nonlinear feedback control system will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

The term "signal," as is used herein, should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, video, and/or text information.

Figure 1:
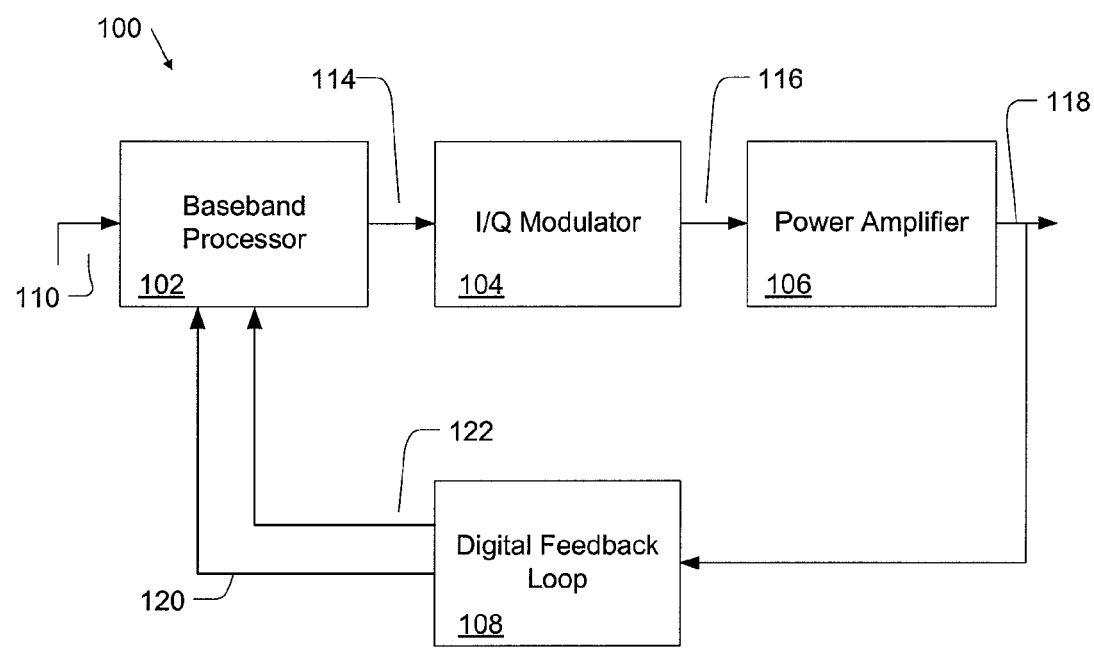
FIG. 1 is a block diagram of a communication transmitter according to one aspect of the invention.

FIG. 1 is a block diagram of a transmitter 100 according to one aspect of the invention. The transmitter 100 includes a baseband processor 102, an I/Q modulator 104, a power amplifier module 106, and a digital feedback path 108.

The baseband processor 102 receives an input signal 110. For example, the input signal 110 may come from a baseband modem (not shown), such as a WCDMA/HSUPA baseband modem. The input signal 110 may include a series of digital symbols, such as WCDMA or HSUPA symbols. The incoming signal may be represented in a rectangular format as an in-phase (I) component and a quadrature (Q) component. The baseband processor 102 pre-distorts the input signal to compensate for nonlinearities in the transmitter 100 and generates a pre-distorted baseband signal 114. For example, the pre-distortion may be designed to compensate for nonlinearities in the power amplifier 106.

The I/Q modulator 104 modulates a radio-frequency (RF) carrier signal based on the I and Q components of the pre-distorted baseband signal 114 to generate a pre-distorted, modulated RF carrier signal 116. The pre-distorted, modulated RF carrier signal includes both the amplitude information and the phase information of the input signal 110. The use of an I/Q modulator instead of a polar modulator broadens the range of compatible amplifiers because there is no need to reintroduce the amplitude component during amplification.

The power amplifier module 106 includes one or more nonlinear power amplifiers. Amplifiers having generally linear response characteristics may be used, but typically will be operated in a non-linear saturation mode for purposes of power efficiency. The power amplifier module 106 receives the pre-distorted, modulated RF carrier signal 116 and amplifies the signal to generate an amplified RF signal 118. The pre-distortion imparted in the baseband processor 114 compensates for the non-linearities of the power amplifier 106, so the amplified RF signal 118 is generally free of distortion and linear with respect to the input signal 110.

The digital feedback path 108 provides digital feedback information from the power amplifier module 106 to the baseband processor 102. For example, as shown in FIG. 1, the digital feedback path receives the amplified RF signal 118 from the power amplifier 106. The digital feedback path 108 detects the actual amplitude and phase of the amplified RF signal 118. For example, the digital feedback path 108 may down-convert the amplified RF signal to baseband analog IQ components, correct the analog IQ components for DC offset, and convert the IQ components to digital format. The digital IQ components may be further adjusted with IQ imbalance correction and digital DC offset correction. The digital feedback path 108 may then convert the digital IQ components to a polar format including a digital feedback amplitude signal 120 and a digital feedback phase signal 122.

The digital feedback path 108 provides these polar feedback signals 120, 122 to the baseband processor 102. The baseband processor 102 uses the polar feedback signals 120, 122 to correct for amplitude and phase errors caused by nonlinearities in the various components of the transmitter 100, particularly the power amplifier 106. For example, during a closed-loop auto-calibration time interval, the baseband processor 102 may collect data regarding the nonlinear relationship between the input signal 110 and the amplified RF signal 118. The baseband processor 102 may store this data in an LUT and use the data during an open-loop operation time interval to pre-distort the baseband signals in a way that compensates for the nonlinearities. This enables efficient operation of the power amplifier 106 in saturation mode yet maintains a linear output from the power amplifier 106.

Figure 2:
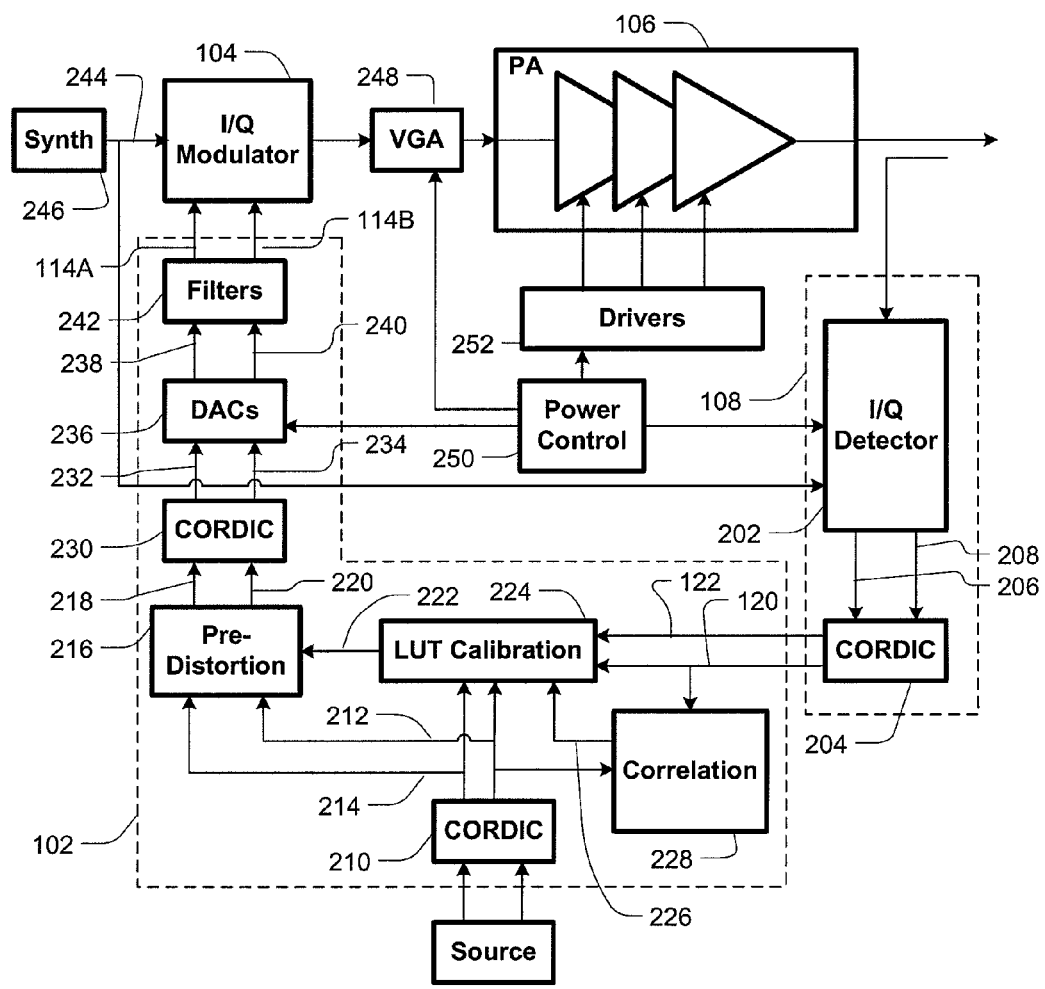
FIG. 2 is a block diagram of a communication transmitter according to another aspect of the invention.

FIG. 2 is a block diagram of a transmitter 200 according to another aspect of the invention. The digital feedback path 108 of this transmitter 200 includes an I/Q detector 202 and a CORDIC polar conversion block 204. The I/Q detector is configured to detect the I and Q components of the amplified RF signal 118 and to generate a pair of I/Q feedback detection signals 206, 208. The CORDIC converter 204 employs a coordinate rotation digital computer algorithm to convert the pair of I/Q feedback detection signals 206, 208 to an amplitude feedback detection signal 120 and a phase feedback detection signal 122.

The baseband processor 102 of the transmitter 200 includes a CORDIC polar conversion module 210 configured to convert the pair of I/Q input signals 110A, 110B into an amplitude component input signal 212 and a phase component input signal 214. These polar input signals 212, 214 are passed to a correction/pre-distortion module 216, which generates a pre-distorted baseband amplitude signal 218 and a pre-distorted phase signal 220 based on the polar input signals 212, 214 and the correction signal 222 from the pre-distortion LUT block 224.

The baseband processor 102 also includes a pre-distortion LUT auto-calibration module 224, which determines the LUT data necessary for proper pre-distortion during a closed-loop auto-calibration interval. For example, the auto-calibration interval may be the first 25 microseconds of a power control slot, during which the digital feedback path 108 is activated. During this time, the LUT auto-calibration module 224 may determine the proper LUT data based on the polar feedback detection signals 120, 122 through a combination of correlation and interpolation, as described in more detail below.

The LUT auto-calibration module 224 receives the polar input signals 212, 214, as well as the polar feedback signals 120, 122. The LUT auto-calibration module 224 also receives a synchronization signal 226, including a synchronization parameter t from the amplitude correlation module 228. The amplitude correlation module 228 processes and correlates the source and detected amplitude waveforms to find the optimum timing alignment, t. This alignment setting information is provided to the LUT auto-calibration module 224 so that the AM-AM LUT data can be properly synchronized. A key benefit of the I/Q approach is that once t is known for the x versus y timing alignment for the AM-AM LUT, then the same t can also be assumed for the AM-PM LUT x versus y alignment.

After a particular auto-calibration interval has ended, the LUT auto-calibration module updates the LUTs in the correction/pre-distortion module 216 with the proper LUT pre-distortion data for use during the subsequent open-loop operation interval. During the operation time interval, the digital feedback path 108 may be deactivated, and proper pre-distortion of the baseband signals may be accomplished using the LUTs of the correction/pre-distortion module 216.

A reverse CORDIC conversion module 230 converts the pre-distorted baseband amplitude signal 218 and the pre-distorted baseband phase signal 220 into a pair of pre-distorted baseband I/Q signals 232, 234. A DAC (digital to analog conversion) module 236 converts the digital pre-distorted baseband I/Q signals 232, 234 into analog signals 238, 240. The filter module 242 may perform any desired baseband filtering and provides the filtered analog pre-distorted baseband I/Q signals 114A, 114B to the I/Q modulator 104.

Based on the filtered analog pre-distorted baseband I/Q signals 114A, 114B, the I/Q modulator modulates an RF carrier wave 244 received from a synthesis module 246 to generate the fully modulated RF signal 116. The fully modulated RF signal 116 includes both the amplitude information and the phase information of the input signals 110A, 110B.

An optional VGA (variable gain amplifier) 248 may adjust the modulated RF signal 116 for input to the power amplifier module 106. A power control module 250 and a driver module 252 control the power level and gain of the power amplifier module 106. The power amplifier module 106 amplifies the modulated RF signal 116 to produce the amplified RF signal 118.

As illustrated in FIG. 2, the correlation module 228, the LUT auto-calibration module 224, and the correction/pre-distortion module 216 operate on polar amplitude and phase signals. Alternatively, the functions of these modules may be carried out on I/Q signals. This would eliminate the need for the CORDIC conversion modules 204, 210, 230, but it would require a more complex, two-dimensional correction scheme. Over the full I/Q space, every possible desired ($I_{DESIRED}$, $Q_{DESIRED}$) combination would map to a corrected ($I_{CORRECTED}$, $Q_{CORRECTED}$) combination, which would then be applied to the I/Q modulator such that the power amplifier would produce the desired ($I_{DESIRED}$, $Q_{DESIRED}$) combination. Both $I_{DESIRED}$ and $Q_{DESIRED}$ would serve as inputs to the LUTs of the correction/pre-distortion module 216, which would generate both $I_{CORRECTED}$ and $Q_{CORRECTED}$ as the pre-distorted baseband I/Q signals 232, 234.

During the proposed 25-microsecond auto-calibration time-interval, ($I_{DETECTED}$, $Q_{DETECTED}$) samples could be detected at the chosen sampling rate in the feedback path. After suitable time-alignment, these detected samples could then be used in conjunction with the corresponding ($I_{APPLIED}$, $Q_{APPLIED}$) values applied to the I/Q modulator in order to define the associated LUT entry.

The following entry would then be added to the two-dimensional LUT for each sample:

Input $I/Q(I_{DESIRED}, Q_{DESIRED}) \leftarrow (I_{DETECTED}, Q_{DETECTED})$

Output $I/Q(I_{CORRECTED}, Q_{CORRECTED}) \leftarrow (I_{APPLIED}, Q_{APPLIED})$ As a practical matter, however, it is preferable to generate and manipulate the pre-distortion LUT data in polar space rather than I/Q space. Auto-calibration of the LUTs is simplified by first converting the signals from I/Q to polar format.

The distortion to be corrected stems mostly from the power amplifier. Although two parameters require correction (amplitude and phase), this correction requirement is actually only one-dimensional. Both the amplitude (AM-AM) and phase (AM-PM) correction coefficients required to compensate for the power amplifier's distortion effects are a function of input amplitude.

Moreover, it is easier to maintain synchronization of the LUT data in the polar space. The key difference involves how synchronization is achieved for the x versus y alignment in filling the LUTs. As noted above, a key benefit of the I/Q approach is that once t is known for the x versus y timing alignment for the AM-AM LUT, then the same t can also be assumed for the AM-PM LUT x versus y alignment.

In other words, simple amplitude correlation processing is sufficient to identify optimum timing alignment in filling both AM-AM and AM-PM LUTs. No amplitude versus phase timing alignment is necessary due to the use of I/Q modulation. Although the signals are converted to polar form for a portion of the forward path, the polar signals are entirely digital and thus perfect synchronization can be maintained. By adopting this synchronization approach with I/Q modulation, no other synchronization solution or hardware is needed.

Pre-distortion in polar space requires two LUTs: one for AM-AM pre-distortion and one for AM-PM pre-distortion. Of course, physical and logical storage and arrangement of these two LUTs may vary according to particular implementation details. For example, the data from these two LUTs may actually be stored as a single table or memory.

During an auto-calibration interval, the correlation module acquires a set of known data pairs, each pair including an X value and a Y value. For example, the X value may be a sample value of the amplitude component input signal 212 and the Y value may be a sample value of the amplitude component feedback signal 120. These values correspond to the AM-AM pre-distortion data described above. Likewise, the X value may be a sample value of the amplitude component input signal 212 and the Y value may be a sample value of the phase component feedback signal 122. These values correspond to the AM-PM pre-distortion data described above.

The auto-calibration interval during which this acquisition of known data pairs takes place may involve processing a specific set of original input values designed to produce a particular set of known data pairs. Alternatively, the processor may leverage a standardized calibration or startup routine to acquire the known data pairs. It is also possible that the data pairs acquired during the auto-calibration process are arbitrary or random in nature for situations where transmit modulation is continuous throughout the auto-calibration interval. Because the data acquisition is performed during the closed-loop auto-calibration interval based on feedback from the actual device output, the acquired data reflects the current nonlinearity of the transmitter 100, 200 and/or power amplifier 108 at the time of auto-calibration. In addition, the auto-calibration process may be performed periodically to account for changes in the nonlinearity of the transmitter 100, 200 and/or power amplifier 108.

The set of known data pairs acquired during the auto-calibration interval may not be complete. There may be data pairs missing from the set. For example, the original input signal processed during the auto-calibration interval may not involve every possible original input value. This results in holes in the set of known data pairs. Interpolation, extrapolation, and/or prediction algorithms may be used to fill these holes and complete the AM-AM and AM-PM pre-distortion lookup tables. For example, the LUT auto-calibration module may use the following equation to interpolate missing data values:

$$y_k = y_{k-1} + dy/dx * (x_k - x_{k-1}).$$

Other interpolation/extrapolation formulas also may be used. In this way, the LUT auto-calibration module may augment the set of known data values with interpolated or extrapolated data.

After the auto-calibration interval is complete, the pre-distortion lookup data are used to pre-distort the device input. In response to a particular original input data value $x_i$, the corresponding pre-distorted input value $y_i$ (or a pre-distorted input value determined from a pre-distortion factor $y_i$) is provided from the lookup tables. Because a complete set of Y values has been assembled during the auto-calibration interval through collection, interpolation, and/or extrapolation, the data in the lookup tables can be used to reliably pre-distort the device input for a desired linear output in an efficient open-loop operating mode. At this point, the digital feedback path 108 of the transmitter 100, 200 may be disabled and the transmitter 100, 200 operates in an efficient open-loop operational mode. In this mode, the lookup tables provide a pre-distorted device input (e.g., pre-distorted baseband amplitude signal 220) or a pre-distortion factor, through use of the stored data pairs. As a result, the transmitter 100, 200 provides the desired linear output.

Figure 3:
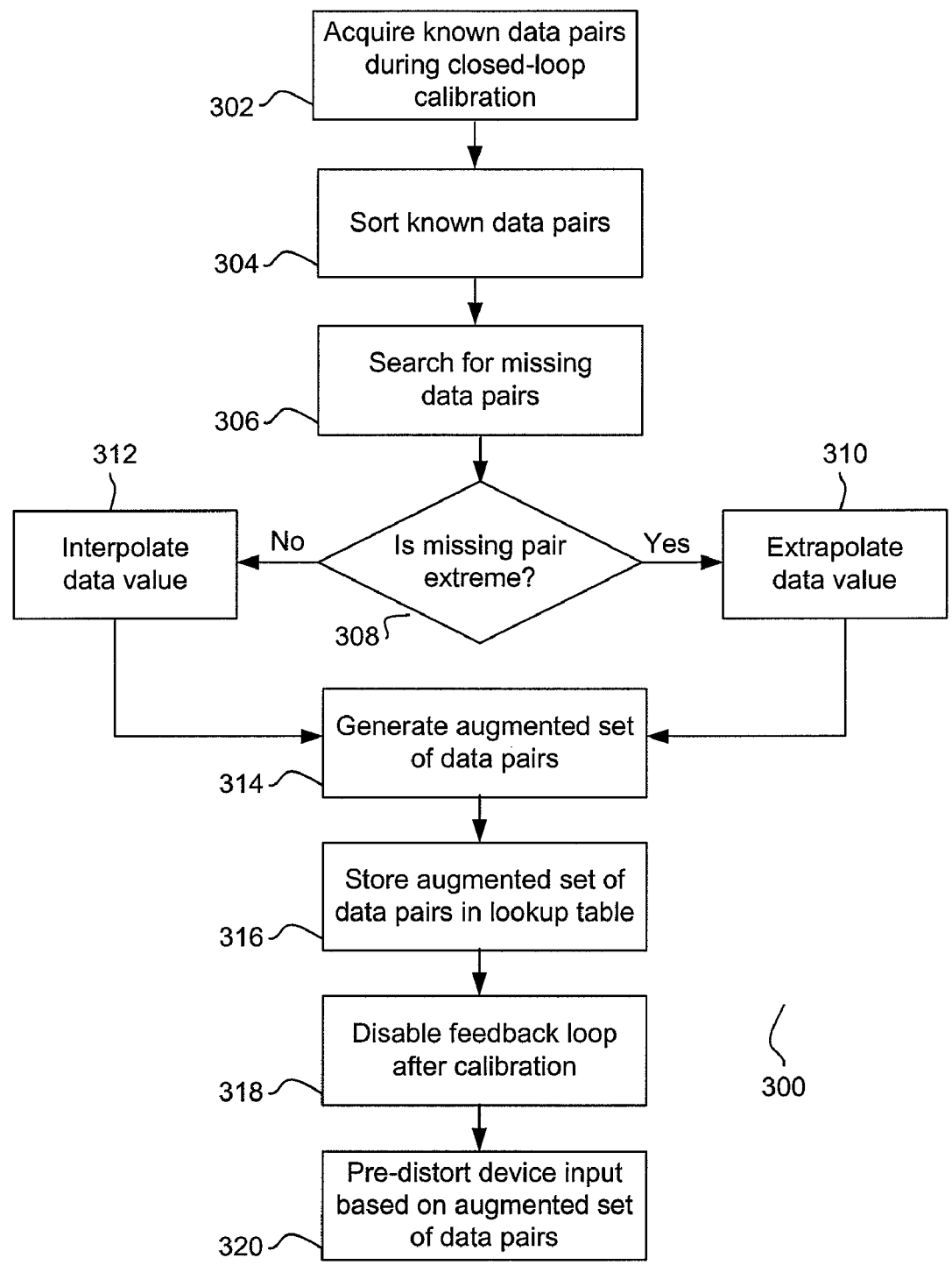
FIG. 3 is a flow diagram illustrating method for pre-distorting an input for use with a communication transmitter according to another aspect of the invention.

FIG. 3 is a flow diagram illustrating a method 300 for pre-distorting a device input according to another aspect of the invention. A set of known data pairs is acquired 302 during a closed-loop auto-calibration interval. For example, known data pairs may be acquired in the manner described above. The known data pairs are then sorted 304, and a search 306 is conducted for missing data pairs, also known as holes in the data. When a missing data pair is identified, it is determined 308 whether or not the missing data pair is an extreme. A missing data pair is an extreme if it falls outside the range of values of known data pairs. If the missing data pair is an extreme, then a data value may be extrapolated 310 based on the values of known data pairs to fill the hole. If the missing data pair is not an extreme, then a data value is interpolated 312 based on other known data values to fill the hole. As an alternative, the method 300 may fill holes in the known data pairs only through interpolation, not extrapolation. In this case, there would be no attempt to fill holes resulting from extreme missing data pairs.

An augmented set of data pairs is generated 314. The augmented set of data pairs includes the known data pairs and one or more interpolated or extrapolated data values. The augmented set of data pairs is stored 316 in a lookup table. Once the auto-calibration interval is complete, the feedback path may be disabled 318 for increased power efficiency. The input of the device (e.g., the baseband amplitude or phase signal) is then pre-distorted 320 based on the augmented set of data pairs stored in the lookup table.

Figure 4:
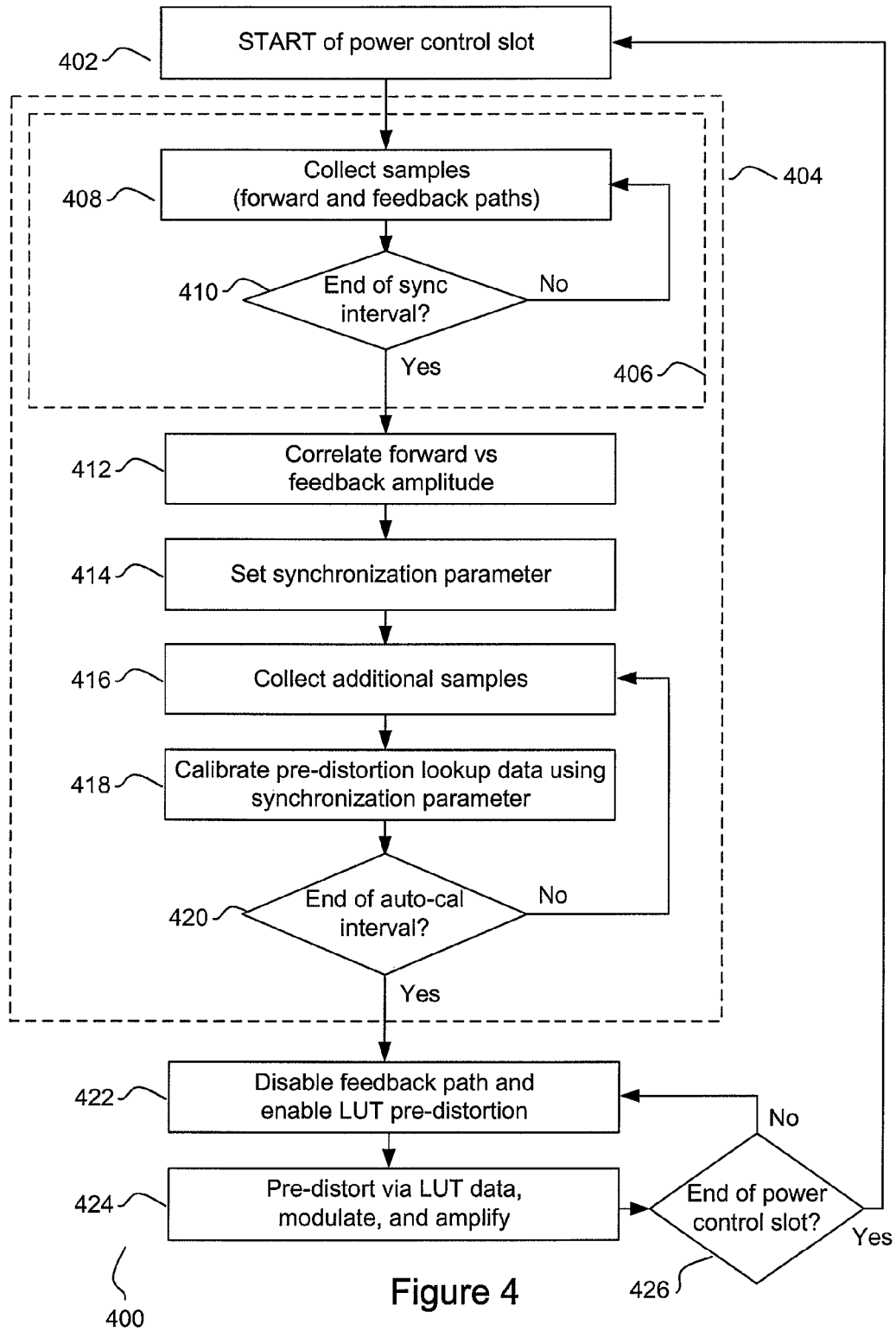
FIG. 4 is a flow diagram illustrating a method for calibrating a pre-distortion LUT and for pre-distorting a baseband signal according to another aspect of the invention.

FIG. 4 is a flow diagram illustrating a method for calibrating a pre-distortion LUT and for pre-distorting a baseband signal according to another aspect of the invention. The method begins, for example, at the start 402 of a power control slot of a communications protocol such as WCDMA/HSUPA. During an auto-calibration interval 404, there is a synchronization interval 406. In the synchronization period, samples are collected 408 for analysis from both the forward and feedback paths. During this time, the digital feedback path 108 is activated. This process repeats until the end 410 of the synchronization interval 406. After the synchronization interval 406, the forward path samples are correlated 412 with the feedback path samples based on amplitude. A synchronization parameter t is then set 414 based on the correlation results. The process continues with the collection 416 of additional samples. As the samples are collected, pre-distortion LUT data is determined 418 using the synchronization parameter t to ensure that the LUT data is properly synchronized. At the end 420 of the auto-calibration interval 404, the LUT data is stored in the pre-distortion LUTs and the LUTs are enabled 422 for open-loop pre-distortion of the baseband signal. For the remainder of the power control slot, the digital feedback path 108 may be deactivated. The baseband input signal is thereafter pre-distorted 424 based on the data in the pre-distortion LUTs, and the pre-distorted baseband signal is used for modulation. This process effectively and efficiently compensates for the nonlinearities in the power amplifier. At the end 426 of the power control slot, the process returns to the start 402 for another auto-calibration interval. The periodic auto-calibration interval enables the transmitter to adapt to changing conditions, such as temperature, which may change the nonlinear response characteristics of the power amplifier.

The methods and systems of the present invention may be realized in software, hardware, or a combination of software and hardware. Any type of computing system or other apparatus adapted for realizing the methods described herein is suitable. In the present context, a program may include any expression, in any language, code or notation, of a set of instructions intended to cause a system having an information processing capability to perform a particular function. It is intended that the foregoing detailed description be regarded as illustrative rather than limiting, and that it be understood that the following claims, including all equivalents, are intended to define the scope of this invention.

The invention claimed is:

1. An I/Q communication transmitter, comprising:
 a pre-distortion lookup table containing pre-distortion lookup data comprising predetermined amplitude correction coefficients and predetermined phase correction coefficients;
 an auto-calibration module in communication with the pre-distortion lookup table, and configured to operate during a closed-loop auto-calibration interval, said auto-calibration module configured to calibrate the pre-distortion lookup data to compensate for a non-linearity in the I/Q communication transmitter by generating and manipulating the predistortion lookup data exclusively in polar form;
 a baseband processor in communication with the pre-distortion lookup table and comprising the auto-calibration module, wherein the baseband processor is configured to
  receive an input signal in an I/Q form,
  convert said input signal from said I/Q form to a polar form so as to obtain an input magnitude signal and an input phase signal,
  use said input magnitude signal and said input phase signal to determine locations within said pre-distortion lookup table for a first amplitude correction coefficient of said predetermined amplitude correction coefficients and a first phase correction coefficient of said predetermined phase correction coefficients necessary for proper pre-distortion of said input signal, and
  generate a pre-distorted baseband I/Q signal pair by performing pre-distortion operations exclusively in a polar domain, and wherein the pre-distortion is based on the first amplitude correction coefficient and the first phase correction coefficient during an open-loop operational interval;

an I/Q modulator in communication with the baseband processor, wherein the I/Q modulator is configured to modulate an RF carrier signal based on the pre-distorted baseband I/Q signal pair and to generate a pre-distorted, modulated RF carrier signal by performing modulation operations in an I/Q domain;

a power amplifier in communication with the baseband processor and the I/Q modulator, wherein the power amplifier is configured to amplify the pre-distorted, modulated RF carrier signal and to generate an amplified RF signal;

a digital feedback path in communication with the power amplifier and the baseband processor, wherein the digital feedback path is configured to process the amplified RF signal to generate a polar feedback signal in a polar form and to provide the polar feedback signal to the baseband processor during the closed-loop auto-calibration interval;

wherein the baseband processor is further configured to perform the following operations for updating the pre-distortion look-up data during the closed-loop auto-calibration interval: generate a polar input signal by converting the input signal from the I/Q form to a polar form; collect data regarding a nonlinear relationship between the polar feedback signal and the polar input signal; and store the data in the pre-distortion lookup table for use during the open-loop operational interval.

2. A communication transmitter as in claim 1, further comprising:
an amplitude correlation module in communication with the auto-calibration module, wherein the amplitude correlation module is configured to correlate a plurality of samples of the polar input signal with a plurality of samples of the polar feedback signal, and wherein the amplitude correlation module is further configured to generate a synchronization factor based on a result of the correlation;
wherein the auto-calibration module is further configured to calibrate the pre-distortion lookup data based in part on the synchronization factor.

3. A communication transmitter as in claim 1, wherein the auto-calibration module is further configured to maintain a pre-distortion synchronization misalignment of two nanoseconds or less.

4. A communication transmitter as in claim 1, wherein the baseband processor further comprises:
a first polar conversion module configured to convert the input signal from the I/Q form to the polar form to generate the polar input signal;
a pre-distortion module in communication with the first polar conversion module and the pre-distortion lookup table, wherein the pre-distortion module is configured to pre-distort the polar input signal and to generate a pre-distorted polar baseband signal; and
a second polar conversion module in communication with the pre-distortion module, wherein the second polar conversion module is configured to convert the pre-distorted polar baseband signal from polar form to I/Q form and to generate the pre-distorted I/Q signal pair.

5. A communication transmitter as in claim 1, wherein:
the pre-distortion lookup data includes a plurality of input signal sample values and a corresponding plurality of pre-distorted baseband signal sample values.

6. A communication transmitter as in claim 5, wherein:
the plurality of input signal sample values are in a polar form; and
the plurality of pre-distorted baseband signal sample values are in a polar form.

7. A communication transmitter as in claim 1, further comprising:
a polar conversion module configured to convert the input signal from an I/Q form into an amplitude component input signal and a phase component input signal;
a second polar conversion module configured to convert a pre-distorted amplitude component baseband signal and a pre-distorted phase component baseband signal from polar form to I/Q form and to generate the pre-distorted I/Q signal pair;
wherein the pre-distortion lookup data includes:
(a) a plurality of sample values of the amplitude component input signal,
(b) a plurality of sample values of the pre-distorted amplitude component baseband signal that correspond to the plurality of sample values of the amplitude component input signal, and
(c) a plurality of sample values of the pre-distorted phase component baseband signal that correspond to the plurality of sample values of the amplitude component input signal.

8. A method for modulating and amplifying an input signal in a communication transmitter, comprising:
activating a digital feedback path during a closed loop auto-calibration interval for obtaining a polar feedback signal in polar form;
generating a polar input signal by converting an input signal from an I/Q form to a polar form during the closed loop auto-calibration interval;
collecting a plurality of samples of the polar input signal and a plurality of samples of the polar feedback signal during the closed loop auto-calibration interval;
correlating the plurality of samples of the polar input signal and the plurality of samples of the polar feedback signal during the closed loop auto-calibration interval;
determining a synchronization factor for synchronizing the plurality of samples of the polar input signal and the plurality of samples of the polar feedback signal during the closed loop auto-calibration interval;
determining pre-distortion lookup data based on the plurality of samples of the polar input signal, the plurality of samples of the polar feedback signal, and the synchronization factor during the closed loop auto-calibration interval;
storing the pre-distortion lookup data in at least one pre-distortion lookup table for use during an open loop operational interval, said pre-distortion lookup data comprising predetermined amplitude correction coefficients and predetermined phase correction coefficients;
deactivating the digital feedback path during the open loop operational interval;
pre-distorting the input signal in the I/Q form based on the pre-distortion lookup data stored in the pre-distortion lookup table to generate a pre-distorted baseband I/Q signal pair, said pre-distorting step performed during the open loop operational interval and exclusively in a polar domain, said pre-distorting step comprising:
converting the input signal from the I/Q form to the polar form to generate an input magnitude signal and an input phase signal;
use said input magnitude signal and said input phase signal to determine locations within said pre-distortion lookup table for a first amplitude correction coefficient of said predetermined amplitude correction coefficients and a first phase correction coefficient of said predetermined phase correction coefficients necessary for proper pre-distortion of said input signal, pre-distorting the input magnitude signal and said input phase signal to generate a pre-distorted polar baseband signal, said pre-distortion based on the first amplitude correction coefficient and the first phase correction coefficient; and converting the pre-distorted polar baseband signal from the polar form to the I/Q form to generate the pre-distorted baseband I/Q signal pair;

modulating an RF carrier signal based on the pre-distorted baseband I/Q signal pair; and amplifying the modulated RF carrier signal.

9. A method for modulating and amplifying an input signal in a communication transmitter as in claim 8, further comprising:

maintaining a pre-distortion synchronization misalignment of two nanoseconds or less.

10. A method for modulating and amplifying an input signal in a communication transmitter as in claim 8, wherein:

the pre-distortion lookup data includes a plurality of input signal sample values and a corresponding plurality of pre-distorted baseband signal sample values.

11. A method for modulating and amplifying an input signal in a communication transmitter as in claim 8, wherein said polar input signal includes an amplitude component signal and a phase component signal; and wherein the pre-distortion lookup data includes:
(a) a plurality of sample values of the amplitude component input signal,
(b) a plurality of sample values of the pre-distorted amplitude component baseband signal that correspond to the plurality of sample values of the amplitude component input signal, and
(c) a plurality of sample values of the pre-distorted phase component baseband signal that correspond to the plurality of sample values of the amplitude component input signal.

* * * * *